(12) United States Patent
Su

(10) Patent No.: US 6,869,733 B1
(45) Date of Patent: Mar. 22, 2005

(54) PELLICLE WITH ANTI-STATIC/ DISSIPATIVE MATERIAL COATING TO PREVENT ELECTROSTATIC DAMAGE ON MASKS

(75) Inventor: Wei-Yu Su, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 165 days.

(21) Appl. No.: 10/261,289

(22) Filed: Sep. 30, 2002

(51) Int. Cl.$^7$ .............................. G03F 9/00; A47G 1/12
(52) U.S. Cl. .............................................. 430/5; 428/14
(58) Field of Search .............................. 430/5; 428/14; 355/75; 382/144

(56) References Cited

U.S. PATENT DOCUMENTS

| | | | |
|---|---|---|---|
| 5,357,116 A | 10/1994 | Talbot et al. | 250/492.21 |
| 5,474,865 A | 12/1995 | Vasudev | 430/5 |
| 5,482,799 A | 1/1996 | Isao et al. | 430/5 |
| 5,533,634 A | 7/1996 | Pan et al. | 216/12 |
| 5,577,610 A | 11/1996 | Okuda et al. | 206/454 |
| 6,149,992 A * | 11/2000 | Nakayama | 428/14 |

* cited by examiner

*Primary Examiner*—Mark Huff
*Assistant Examiner*—Saleha Mohamedulla

(57) ABSTRACT

The present invention is a method of protecting reticles from electrostatic damage during their use in manufacturing lines and while patterning photoresist films on device substrates. An anti-static layer comprised of an ammonium salt is formed on both sides of a pellicle which is then attached to a metal frame that has been coated with an anti-static layer of the ammonium salt. The frame with attached pellicle is connected to a reticle by an adhesive. Any electrostatic charges that form on the surface of the anti-static layers or on the reticle are conducted into the metal frame where they are dissipated. The ammonium salt is preferably $(RN_4+)$ Cl— in which $(RN_4+)$ has the structure:

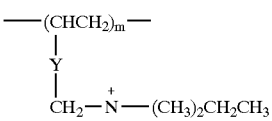

where Y is an alkyl group or $C_6H_4$, m=1 to 10000, and $X^-$ is $Cl^-$.

30 Claims, 4 Drawing Sheets

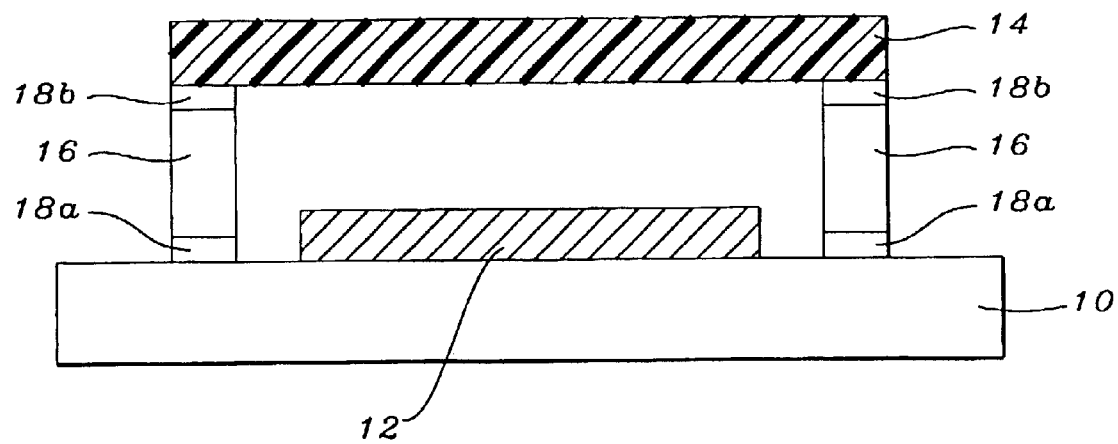
FIG. 1 – Prior Art
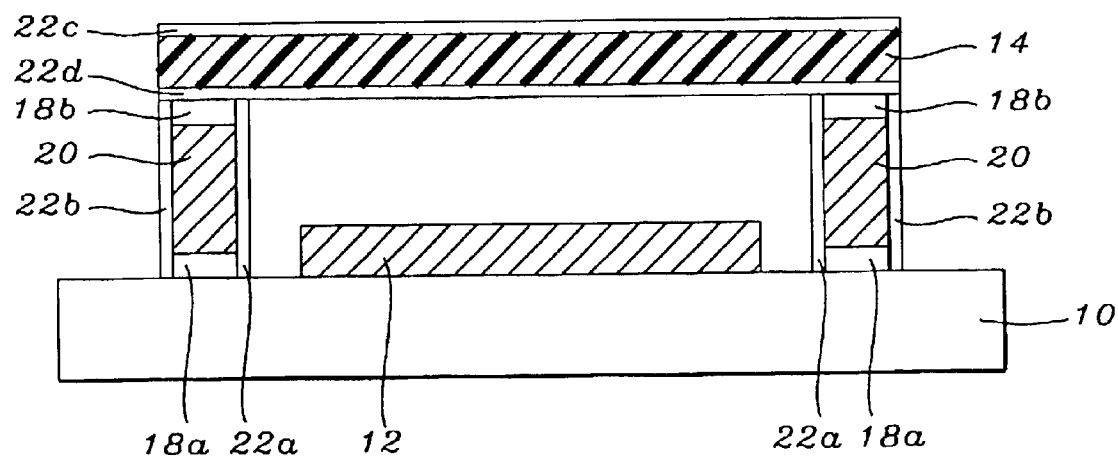
FIG. 2a

PELLICLE WITH ANTI-STATIC/ DISSIPATIVE MATERIAL COATING TO PREVENT ELECTROSTATIC DAMAGE ON MASKS

FIELD OF THE INVENTION

The present invention relates to a method of protecting reticles or masks used for the production of semiconductor devices. In particular, the method involves applying an anti-static coating to a pellicle and a frame holding the pellicle to dissipate charge build up on the attached reticle.

BACKGROUND OF THE INVENTION

Reticles or masks are comprised of a patterned opaque coating such as chrome on a transparent substrate and are used to manufacture integrated circuits for semiconductor devices, MEMS devices, or other devices requiring the formation of small features on a substrate. High quality reticles are quite valuable because of the time and expense needed to produce them. The time required to build a reticle can take up to two weeks and the cost can easily be $20,000 or more because expensive electron beam tools are used to form patterns and expensive focused ion beam tools may be employed to repair defects.

Reticles are usually fabricated by forming a pattern in a photoresist film on an underlying opaque coating on a substrate. The pattern in the photoresist is transferred through the underlying opaque coating by an etch step. The photoresist serves as an etch mask and regions which are clear of photoresist before etch become regions clear of opaque coating after etch. The amount of opaque coating remaining on the substrate after the etch transfer can vary from a few % to nearly all of the original surface area. One of the most common substrates is quartz which is transparent to wavelengths in the range of 190 nm to 600 nm that are used to expose photoresist films on substrates during the manufacture of integrated circuits.

During the manufacture of integrated circuits, reticles must be protected from particles that might adhere to its surface: A covering consisting of a thin film called a pellicle is mounted on a frame or spacer to connect the pellicle to a reticle but leaving an air gap between the reticle and pellicle. Dust particles are kept off the reticle by collecting on the pellicle which is typically a thin film of highly transparent material such as nitrocellulose. Any particle that collects on the pellicle does not affect the aerial image of the pattern transmitted from the reticle onto the photoresist film on a device substrate. Since the particle is not in the focal plane on the reticle surface, its image is not reproduced on the photoresist film. Otherwise, any particle that collects on a clear quartz region on a reticle is reproduced as a defect in the photoresist film and can eventually degrade the performance of the resulting device. U.S. Pat. No. 5,577,610 describes an anti-static casing to hold frame supported pellicles and keep particles from collecting on pellicle surfaces. The casing only touches the pellicle frame at a few points while it is in storage and is not useful for dissipating electrostatic charges that can form on a reticle while it is connected to a pellicle by a frame in an exposure tool or in transit between an exposure tool and storage.

Occasionally, pellicles must be replaced because they become torn during handling or because repeated exposure causes light transmission through them to decrease to an unacceptable level. A decrease in transmission means the exposure tool will have to be used for a longer period to expose each substrate with a predetermined dosage level needed to pattern a photoresist. This is costly because the throughput of the production line will be reduced to give fewer devices per unit time.

Besides particle defects, another big concern associated with handling reticles is electrostatic charge build up on the reticle which if not readily dissipated can cause electrostatic damage to the reticle. The quartz substrate is an insulator and therefore electrostatic charges can easily build up on the surface. A charge build up on the metallic chrome coating can also occur. Small quartz spaces between two chrome features are especially susceptible to damage. For example, an electrical bridge is likely to form in a small quartz space between the ends of two chrome features on a reticle as depicted in FIGS. 4a–4d. Damage to the quartz can lead to a loss of transmission through the affected area and the pattern transferred into the photoresist film in a subsequent device patterning step will not be reproduced accurately from the mask design. Instead, the chrome regions next to the damaged quartz will appear as oversized photoresist features that may bridge together because the intensity of the light through the damaged quartz is not sufficient to form an opening in the photoresist film as intended.

Electrostatic charges can also form on the pellicle film which is an insulator and these charges can migrate to the reticle. Therefore, it will be an advantage to have a method of preventing charge build up on a reticle that is also effective in avoiding charging on pellicle surfaces.

In prior art, anti-static coatings have been applied to reticles during the reticle fabrication process to prevent charge build up during pattern formation with an electron beam tool. U.S. Pat. No. 5,533,634 mentions the use of alumina as an anti-static layer which is etched and stripped prior to the end of the mask making process. Similarly, U.S. Pat. No. 5,482,799 describes the use of a molybdenum film for charge dissipation on a substrate during a mask making process. Again, the conductive film is sacrificial and does not remain on the reticle when it is used in a manufacturing line to fabricate integrated circuits.

Another example in which a conductive film is applied to a reticle to prevent charge build up is found in U.S. Pat. No. 5,357,116. A layer of an ammonium salt is coated on a reticle before a focused ion beam (FIB) repair step to allow an accurate placement of the beam on the substrate. The conductive layer is also useful for avoiding charging during processing with an electron beam exposure. The preferred thickness is about 1 micron to provide adequate step coverage over chrome lines. The layer is removed at the end of the fabrication process and does not protect the reticle once it is released to a device manufacturing line.

Others skilled in the art have produced reticles in which a light absorbing material is formed inside a transparent substrate rather than on a substrate surface. The structure described in U.S. Pat. No. 5,474,865 does not require a pellicle and can prevent electrostatic damage to quartz between the opaque components inside the substrate. However, the process of producing and repairing the reticle would be quite expensive and make it unattractive for a low cost device manufacturing process.

Therefore, an improved method of protecting a reticle from charge build up and damage to its quartz substrate is needed. In particular, the protective material should be effective during the entire time the reticle is in a manufacturing environment. The protective method should ideally be capable of dissipating charges from the reticle and pellicle while they are in an exposure tool, in storage, or in transit between an exposure process and a storage mode. The method should be cost effective and easy to implement in a manufacturing line.

SUMMARY OF THE INVENTION

An objective of the present invention is to provide a method of protecting a reticle from electrostatic damage while it is being used or stored in a manufacturing environment. The method should be cost effective and easily implemented in a device manufacturing process.

A further objective of the present invention is to provide a method of dissipating electrostatic charges on pellicles that might be transferred to an attached reticle. Ideally, the same method which protects a reticle can be applied to a pellicle while it is attached to a reticle by means of a frame or spacer.

A still further objective of the present invention is to provide an article by which electrostatic charges can be directed away from a reticle or pellicle so that there is no electrostatic damage to the protected reticle during its use or storage in a manufacturing line.

These objectives are achieved by a method of forming a charge dissipating layer on both faces of a pellicle and on its metal frame and connecting the pellicle to the frame and the frame to a reticle. A lesser benefit is observed if the charge dissipating layer is formed only on the pellicle or only on the frame. The charge dissipating layer is preferably a quaternary ammonium salt $(R_4N+)X^-$ where $R_4N+$ has the structure:

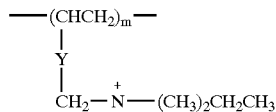

and Y is alkyl or preferably $C_6H_4$, m=1 to 10000, and $X^-$ is $Cl^-$. The ammonium salt is dissolved in water or in a suitable alcohol solvent and applied by immersing the metal frame in the ammonium salt solution and then air drying. A dilution of the same solution is applied to a pellicle followed by spin coating and drying. As shown in FIG. 2, the conductive coating covers both faces of the pellicle and both the inner and outer portions of the frame which is preferably aluminum. The frame is connected to the pellicle on one of its open rectangular sides and is attached to the reticle on the opposite open side. Any charge that forms on the pellicle or on its two ammonium salt layers or on the reticle is channeled into the aluminum frame with the aid of the conductive layers covering the metal frame. This prevents electrostatic build up on a reticle or pellicle that can damage the reticle. The anti-static film remains effective as long as the pellicle is attached to the frame and the frame is connected to the reticle. Therefore, the reticle can be protected from charge build up whether it is in an exposure tool, in storage or in transit between an exposure process and storage.

The invention is also an article comprised of a pellicle and its metal frame which has an anti-static coating on its surfaces. The ammonium salt is commercially available and can be easily applied to form a permanent layer on the pellicle and its frame. The thickness of the anti-static coating on the pellicle is less than 500 Angstroms and preferably about 100 Angstroms to maximize the transmission of light through the anti-static layer. Preferably, greater than 95% of the incident exposing radiation should pass through the pellicle and two anti-static layers and reach the reticle in a photoresist patterning process.

The method is an improvement over prior art in that it consists of forming a permanent anti-static layer on a pellicle and its frame that is effective in protecting a reticle in a device manufacturing line as long as the pellicle and frame are attached to the reticle. The lifetime of the expensive reticle is extended and this reduces the manufacturing cost of the resulting devices built with the reticle. Since over twenty reticles may be required to build a particular device and several different devices may be produced simultaneously within a manufacturing line, the benefit of implementing the improvement on several reticle sets can be magnified several times.

BRIEF DESCRIPTION OF THE DRAWINGS

The drawings are intended to provide a more thorough understanding of the invention. The drawings illustrate embodiments of the invention and together with the description serve to explain the principles of the present invention.

FIG. 1 is a cross sectional view of a pellicle mounted on a frame over a reticle as described in prior art.

FIG. 2a is a cross sectional view of anti-static layers on a pellicle and its metal frame in accordance with an embodiment of the present invention.

DETAILED DESCRIPTION OF THE INVENTION

Figure 2B:
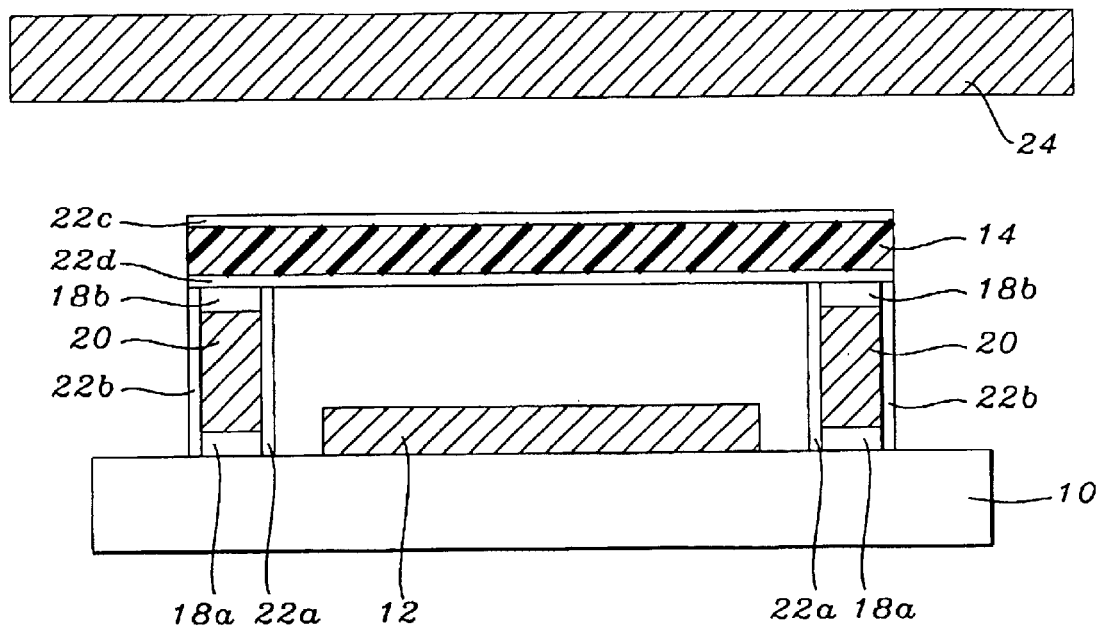
FIG. 2b shows a charged plate positioned over the structure that was depicted in FIG. 2a and represents the experiment used to test the effectiveness of the anti-static layers of the present invention.

The present invention provides a method for protecting reticles from electrostatic damage during their lifetime in a device manufacturing line. In one embodiment, the method of coating a pellicle and its metal frame with an anti-static layer and attaching the frame to a reticle is used to protect the reticle from charge build up in an exposure process, in storage, or in transit between an exposure process and storage. The method also prevents a charge build up on the pellicle that could be transmitted to the reticle through a metal connecting frame or through space.

Referring to FIG. 1, a reticle as described in prior art is comprised of a transparent substrate 10 and patterned opaque coating 12 and is protected from dust particles adhering to its surface by means of a pellicle 14 that is fastened to a frame or spacer 16 with adhesive 18b. The frame 16 is attached to substrate 10 with adhesive layer 18a. Frame 16 can be comprised of metal or plastic material. Pellicle 14 is highly transparent to a wavelength or group of wavelengths in the range of 190 to 600 nm which passes through pellicle 14 and substrate 10 to pattern a photoresist film on a device substrate. Any particles that adhere to clear regions of substrate 12 are printed as defects in the photoresist film during the patterning process. These defects can be transferred into the underlying device substrate and cause a loss of performance. In the case of i-line patterning (365 nm wavelength) or Deep UV patterning with wavelengths in the range of 230 to 300 nm and preferably 248 nm radiation, a commonly used pellicle is made from nitrocellulose.

The structure shown in FIG. 1 can be stored in an anti-static box which offers some protection from charge build up in storage but is not effective in preventing electrostatic damage if the reticle is already charged when it is placed in the box or when it is in use outside the box. An improved method of protecting a reticle is required that is effective in all situations when the reticle is in a manufacturing line.

The inventors have discovered a more effective method of protecting a reticle from electrostatic damage as illustrated in FIG. 2a. A pellicle 14 is coated with an anti-static material on both of its faces to form layers 22c and 22d. A metal frame 20 which is preferably aluminum is also coated with the anti-static material to form layer 22a on its inner surface and layer 22b on its outer surface. The frame can also be comprised of another good conducting metal such as copper or an aluminum/copper alloy. Pellicle 14 is then fastened to frame 20 with an adhesive 18b. Frame 20 is then connected to substrate 10 with adhesive layer 18a Patterned chrome coating 12 and regions of substrate 10 that are directly below pellicle 14 are protected from dust particles in the surrounding environment. Both substrate 10 and chrome 12 are protected from electrostatic charge build up.

Layers 22a and 22b are formed by immersing frame 20 in an aqueous or an alcohol solution of an anti-static compound which Is a quaternary ammonium salt $(R_4N+)X^-$ in which $R_4N+$ has the structure:

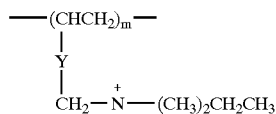

where Y is an alkyl group or preferably $C_6H_4$, m is 1 to 10000, and $X^-$ is $Cl^-$. In order to achieve a desired thickness of layers 22a and 22b of 0.5 to 10 microns and preferably 1.5 microns, frame 20 is immersed in a 1.5% solution of the ammonium salt in water or a suitable alcohol solvent for 1 to 60 seconds and preferably 10 seconds and is then air dried for 60 minutes.

Layer 22c is formed by using a 0.5% solution of the ammonium salt in a water or alcohol solvent. A technique involving the application of a puddle of ammonium salt solution to the center of pellicle 14 followed by spinning is used to form a layer 22c of 500 Angstroms thickness or less and preferably about 100 Angstroms thick. The pellicle is preferably comprised of nitrocellulose. An adhesion promoter is not necessary since the polar ammonium salt readily adheres to the polar surface of the pellicle. After layer 22c is dried by spinning the pellicle 14, the pellicle is inverted and the spin coating and drying process is repeated to form layer 22d on the opposite face which has equal thickness to layer 22c.

The ammonium salt is commercially available from Huntsman Company as product ED-20031D-230 and is particularly compatible with nitrocellulose pellicles used for i-line and Deep UV patterning and exposure wavelengths in the 230 to 600 nm range. Those skilled in the art will recognize that for patterning with wavelengths below 230 nm, care must be taken to select pellicle materials and an ammonium salt that have little or no aromatic content to enable a high transmission, preferably >95% transmission, through the stack comprised of 22a, 14 and 22b. For example, in 193 nm patterning using an ArF radiation source, the benzene ring in $(R_4N+)X^-$ can be removed resulting in an $R_4N+$ structure in which all four R groups are alkyl groups.

Pellicle 14 is fastened to frame 20 by applying an adhesive 18b to one of the two open rectangular sides of frame 20. Layer 22d on pellicle 14 is positioned over the open side of frame 20 with layer 18b and pressed against it to form a connection by means of adhesive 18b on frame 20. After a sufficient drying period that is typically 10 minutes, the frame 20 and attached pellicle 14 are ready to connect to substrate 10 of the reticle. The adhesive can be selected from a group comprised of conducting and anti-static materials and is preferably Fluoro-acrylate which is an anti-static material commercially available from Huntsman Company. The adhesive used to form the bond between pellicle 14 and frame 20 is then applied to the other open rectangular side of frame 20 to form layer 18a. Layer 18a on frame 20 is then positioned over substrate 10 and pressed against it to form a connection. After a sufficient drying period of about 10 minutes, the reticle with attached frame 20 and pellicle 14 is stored in an anti-static box until needed for a photoresist patterning process.

Figure 3:
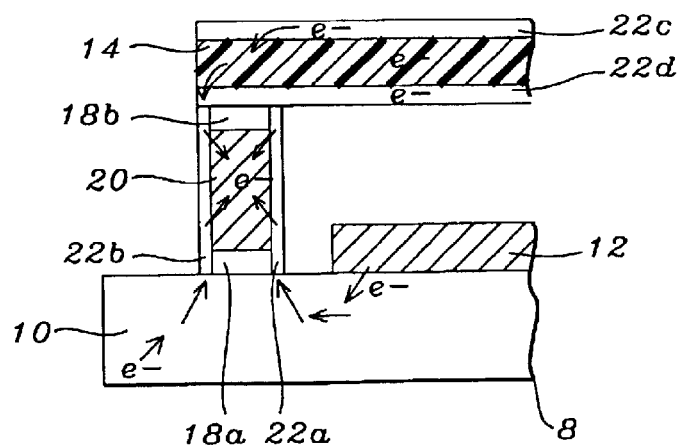
FIG. 3 is a cross sectional view of part of the structure shown in FIG. 2a and illustrates how electrons are dissipated from the pellicle and reticle into the metal frame using the conductive layers of the present invention.

The effectiveness of the anti-static layers in preventing charge build up on the reticle 8 or on pellicle 14 is illustrated in FIG. 3. Electrons representing electrostatic charges that form on layers 22c or 22d or on pellicle 14 are channeled to the edge of pellicle 14 through layers 22c and 22d and pass through conductive layers 22a or 22b into aluminum frame 20. Electrostatic charges that form on chrome 12 or on substrate 10 of reticle 8 pass through conductive layers 22a and 22b into aluminum frame 20. In this manner, charges that form on reticle 8 are dissipated before they can build up and cause electrostatic damage to reticle 8.

The effectiveness of the anti-static layers in preventing electrostatic damage to reticle 8 can be determined using an experimental setup as shown in FIG. 2b. A rectangular shaped charge plate 24 is positioned over and parallel to pellicle 14 such that layer 22c is located about 5 cm from the bottom of the charge plate 24. Three different voltages simulating electrostatic charges in a manufacturing environment are applied by charge plate 24 and an induced charge forms on reticle 8, frame 20 and pellicle 14. The amount of time required for the discharge to be dissipated by the frame and the residual voltage in the frame are monitored by a static field meter that is positioned about 1 inch above the frame. This process is useful for comparing the effectiveness of anti-static layers in dissipating electrostatic charge away from reticle 8. This static discharge test is also used to evaluate a reticle that is attached to a frame and pellicle that do not have anti-static layers.

In a second method to measure the effectiveness of the anti-static layers, an electrical test involving a special test reticle called an ESD reticle is employed which has a design as partially represented in FIGS. 4a–4d. Three different voltages are applied by charge plate 24 for a period of 30 seconds. The test reticle is then examined by the use of a scanning electron microscope (SEM) to determine if any damage has occurred in quartz region 40 or to chrome lines.

Figure 4A:
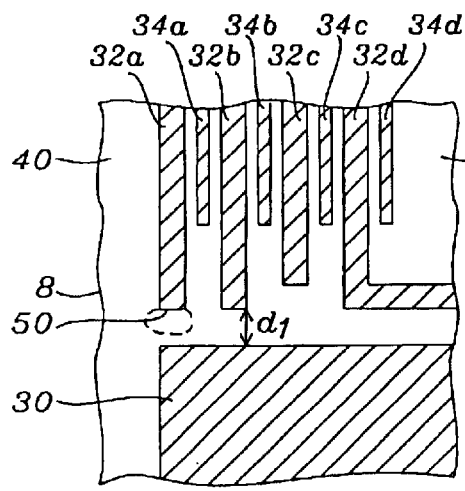
FIGS. 4a–4d are top down views of portions of a test reticle that was connected to a frame and pellicle which were not protected with an anti-static layer of the present invention and then tested according to the experimental arrangement shown in FIG. 2b.
Figure 5:
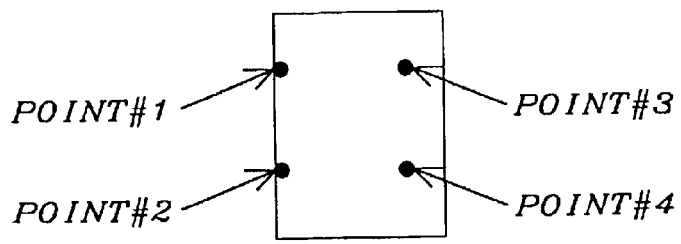
FIG. 5 shows the points on the test reticle that correspond to the top down views in FIGS. 4a–4d and in FIGS. 6a–6d.

FIG. 4a is an enlarged view of a section of reticle 8, the ESD reticle, which corresponds to point 1 in the top down view of reticle 8 shown in FIG. 5. Charge plate 24 was used to apply a >8000 volt charge to reticle 8 and a frame and pellicle that were not coated with anti-static layers. Chrome lines 32a and 32b in FIG. 4a are 1 micron in width and several microns in length and are separated from chrome 30 by a quartz region 40 of dimension $d_1$ which is 1 micron. A chrome line 34a which is 0.4 microns wide is between 32a and 32b and is separated from them by a quartz space of 1 micron. Similarly, chrome line 34b is between 32b and 32c and is separated from them by a clear quartz region which is 1 micron wide. Chrome line 32c is a 1 micron wide line that is separated from chrome 30 by a larger space width than $d_1$ while chrome line 32d is also one micron wide but has one section running parallel to 32c and one section running parallel to the side of adjacent chrome region 30. Chrome lines 34c and 34d are of equal size and shape to 34a and 34b. Additional 1 um and 0.4 um lines similar to those shown in FIG. 4a are located to the right of 34d on reticle 8 but are not included in the drawing.

Because reticle 8 was attached to a frame and pellicle that were not coated with an anti-static layer according to the present invention, electrostatic damage has occurred at site 50 at the end of line 32a after a >8000 volt charge was applied for a period of 30 seconds. If this damaged reticle is subsequently used to pattern a photoresist on a device substrate, the resulting space widths in the photoresist film corresponding to $d_1$ will be outside a specified tolerance which is preferably +30% of a targeted value. For example, the space width between feature 32a and feature 30 in the photoresist film will be significantly smaller than the space width $d_1$ between feature 32b and feature 30 in the photoresist pattern. The damaged reticle will no longer be useful for manufacturing and if electrostatic damage is widespread, it may not be repairable.

Figure 4B:
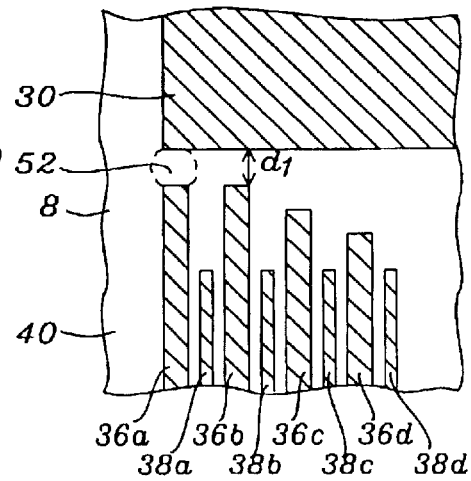

FIG. 4b is an enlarged view of a section of FIG. 5 corresponding to point 2 on test reticle 8. Chrome lines 36a and 36b have similar shape and size to that described for 32a and 32b in FIG. 4a. Chrome lines 38a–38d have similar size and shape to lines 34a–34d in FIG. 4a and are separated from adjacent 1 micron lines by a quartz distance of 1.5 microns. Chrome region 30 is separated from the ends of 36a and 36b by distance $d_1$ in quartz 40. Electrostatic damage has occurred in quartz region 52 between line 36a and chrome 30 after a >8000 volt charge was applied with charge plate 24 to reticle 8 and an attached frame and pellicle that have no anti-static layers. As a result of the damage to the end of line 36a, the transmission through region 52 at the end of line 36a will be less than through quartz 40 between the end of line 38b and chrome 30. This will cause an unacceptable variation in space widths of dimension $d_1$ in the pattern that is printed in photoresist on a device substrate. Therefore, this unprotected reticle 8 would no longer be useful in a manufacturing environment.

Figure 4C:
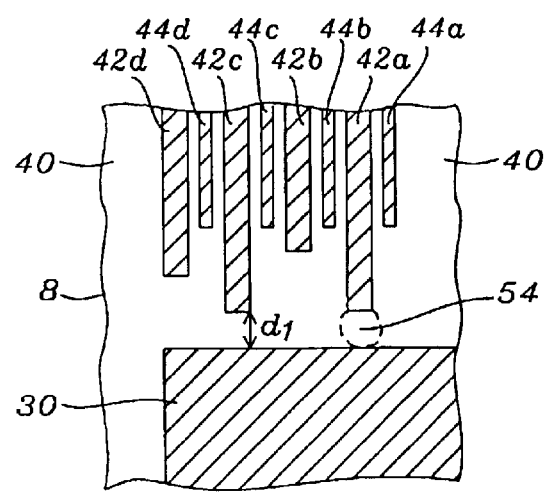

FIG. 4c is an enlarged view of a section of FIG. 5 corresponding to point 3 on test reticle 8. Chrome lines 42a and 42c have similar shape and size to that described for 32a and 32b in FIG. 4a. Chrome lines 44a–44d have similar size and shape to lines 34a–34d in FIG. 4a and are separated from adjacent 1 micron lines by a quartz distance of 1.5 microns. Chrome region 30 is separated from the ends of 42a and 42c by distance $d_1$ in quartz 40. Electrostatic damage has occurred in quartz region 54 between line 42a and chrome 30 after a >8000 volt charge was applied with the charge plate 24 to reticle 8 and an attached frame and pellicle that have no anti-static layers.

Figure 4D:
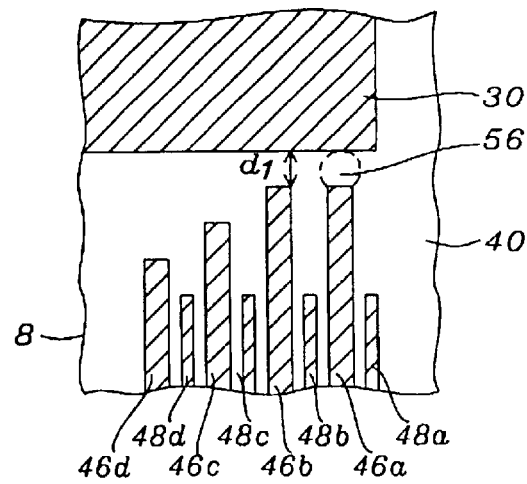

FIG. 4d is an enlarged view of a section of FIG. 5 corresponding to point 4 on test reticle 8. Chrome lines 46a and 46b have similar shape and size to that described for 32a and 32b in FIG. 4a. Chrome lines 48a–48d have similar size and shape to lines 34a–34d in FIG. 4a and are separated from adjacent 1 micron lines by a quartz distance of 1.5 microns. Chrome region 30 is separated from the ends of 46a and 46b by distance $d_1$ in quartz 40. Electrostatic damage has occurred in quartz region 56 between line 46a and chrome 30 after a >8000 volt charge was applied with the charge plate 24 to reticle 8 and an attached frame and pellicle that have no anti-static layers.

A summary of the results when three different voltages were applied by charge plate 24 to test reticle 8 while attached to a frame and pellicle with and without anti-static layers is provided below in Table 1. In the case where the anti-static coating is applied to the pellicle only, electrostatic damage (ESD) is prevented in the 700V and 2000V applications. However, some damage is noted after an >8000 V application at point #3 corresponding to region 54 in FIG. 4c and on some 0.4 micron chrome lines. When test reticle 8 is attached to a frame 20 and pellicle 14 which both have anti-static layers in accordance with the present invention as shown in FIG. 2a, then no electrostatic damage was detected at any of the four locations in FIG. 5 as shown in enlarged drawings represented in FIGS. 6a–6d.

TABLE 1

Damage Assessment after Voltages Applied to Pellicle and ESD Test Reticle

| Voltage | Anti-static coating on pellicle only | Anti-static coating on pellicle & frame | No anti-static coating |
| --- | --- | --- | --- |
| 700 V | No ESD | No ESD | ESD on 0.4 um lines |
| 2000 V | No ESD | No ESD | Some ESD at point 3 |
| >8000 V | Some ESD at point 3 and on 0.4 um lines | No ESD | ESD at all points 1–4 and damage on 0.4 um lines |

The other test that can be performed with charge plate 24 and reticle 8 shown in FIG. 2b to determine the effectiveness of anti-static layers in dissipating electrostatic charges is called a static shield test. A 15 kV charge from the charge plate induces a charge on the underlying pellicle, frame and reticle which is monitored with a field meter that is attached to the surface of the pellicle, frame and reticle. The magnitude of the induced charge is measured along with the time to discharge or dissipate the charge until the residual voltage is below 1000V. Results are listed in Table 2 below. In summary, the anti-static layers on the pellicle provide some benefit in reducing the magnitude of the induced charge and decreasing the discharge time. However, a much larger benefit is found when the anti-static coating is present on both the pellicle and on the attached frame.

TABLE 2

Induced Charge Magnitude and Discharge Time as a Function of Coating Type

| Anti-static coating | Induced Charge from 15 kV test | Discharge time for <1 kV residue | Performance |
| --- | --- | --- | --- |
| Pellicle only | 3–5 kV | ~15 seconds | Improved |
| Pellicle and Frame | < 1 kV | ≦6 seconds | Significantly improved |
| No coating | 8–10 kV | >30 seconds | Not acceptable |

Figure 6A:
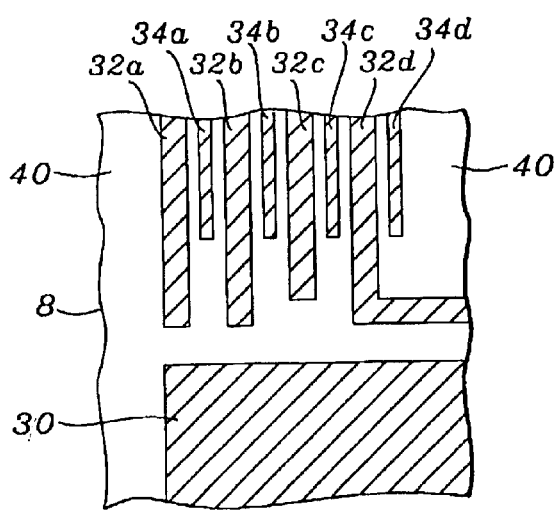
FIGS. 6a–6d are top down views of portions of a test reticle that was connected to a frame and pellicle protected by an anti-static layer of the present invention and tested according to the experimental arrangement shown in FIG. 2b.
Figure 6B:
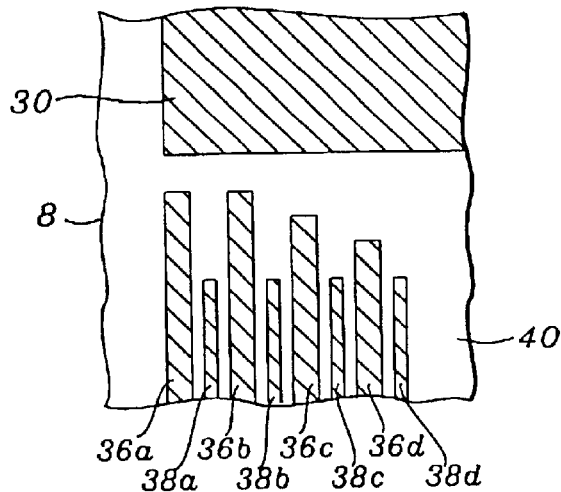
Figure 6C:
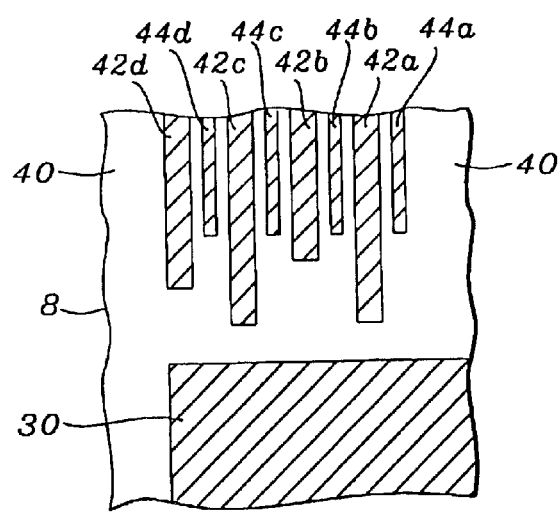
Figure 6D:
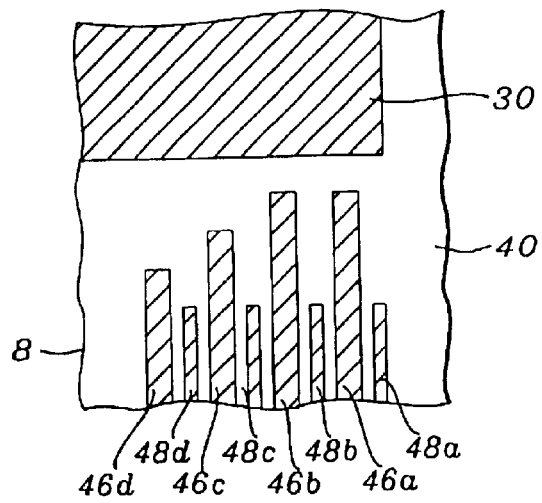

Referring to FIGS. 6a–6d, enlarged top down views representing points 1 to 4 in FIG. 5 show that no electrostatic damage has occurred, especially in regions that are most susceptible such as the quartz regions 40 with dimension $d_1$ between 1 micron chrome lines and an adjacent chrome region 30. For example, in FIG. 6a there is no electrostatic damage between line 32a and chrome 30 after a voltage of >8000V was applied from the charge plate 24 depicted in FIG. 2b. In FIG. 6b, there is no electrostatic damage between line 36a and chrome 30 after a similar voltage is applied for 30 seconds. In FIG. 6c, there is no electrostatic damage between line 42a and chrome 30 resulting from an application of >8000V from the charge plate 24 for a period of 30 seconds. In FIG. 6d, there is no electrostatic damage between line 46a and chrome 30 resulting from an application of >8000V from the charge plate 24 for a period of 30 seconds. In addition there is no damage to any of the 1 micron or 0.4 micron lines shown in FIGS. 6a–6d as a result of the high voltage application. These results demonstrate a significant improvement over prior art in which the reticle is damaged at several sites as illustrated in FIGS. 4a–4d in an identical test situation.

The present invention is effective in protecting a reticle from electrostatic damage and the method of coating a pellicle and frame with an anti-static layer can be readily implemented since the coating process can be performed when the reticle is not in use and will not have a negative impact on throughput. The coating process is performed only once during the lifetime of the pellicle. The frame can be recoated with an anti-static layer more than once if for some reason the reticle must be detached for cleaning or repair. Since the anti-static layer provides a high transmission of exposing wavelengths in a subsequent photoresist patterning process, its presence does not slow the throughput of the manufacturing process. Instead, the present invention reduces manufacturing cost because the expensive reticles have a longer lifetime since they are no longer damaged by electrostatic forces in an exposure process, in storage, or in transit between an exposure process and storage.

In another embodiment, the present invention is an article that is useful for protecting a reticle from electrostatic damage and is comprised of a pellicle that has an anti-static layer on both its sides which are perpendicular to incident exposing radiation and a rectangular metal frame which is attached to the pellicle on one of its open ends and has an anti-static layer on its sides which are perpendicular to the pellicle. The frame is connected by an adhesive to a reticle on the open rectangular end that is opposite to the pellicle side. The adhesive is selected from a group comprised of conducting and anti-static materials and is preferably Fluoro-acrylate which is an anti-static material that is available from Huntsman Company.

The anti-static layers on the pellicle and on the frame prevent electrostatic damage to the attached reticle. The frame is preferably aluminum or another good conductor and an anti-static layer approximately 1.5 microns thick is formed by immersing the frame in a 1.5% solution of an ammonium salt in an aqueous or alcohol solvent and then air drying. The anti-static material is preferably a quaternary ammonium salt $(R_4N+)X^-$ in which $R_4N+$ has the structure:

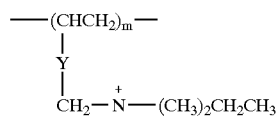

where Y is alkyl or preferably $C_6H_4$, m=1 to 10000, and $X^-$ is $Cl^-$. The pellicle is spin coated with a 0.5% ammonium salt solution as described in the first embodiment to form a film thickness less than 500 Angstroms and preferably about 100 Angstroms. The process is repeated to form an anti-static layer on the opposite face of the pellicle. The thickness can be adjusted so that the transmission of wavelengths in the range of 190 nm to 600 nm through the pellicle and two anti-static layers is greater than 95%.

If the pellicle becomes torn or % transmission drops below 95% because of repeated exposure to radiation, the pellicle can be replaced with a similar pellicle that has two anti-static layers. The original frame with its original anti-static layers can be connected to the new pellicle or the original anti-static layer on the frame can be stripped and recoated before it is attached to the new pellicle. Similarly, if the reticle requires cleaning or repair, the frame can be disconnected and then reattached once the reticle is returned from cleaning or repair.

In another embodiment which provides some protection to the reticle but is not as beneficial as the first embodiment, especially when high electrostatic voltages may be present, the present invention is an article comprised of a pellicle that has an anti-static layer on both its sides which are perpendicular to incident exposing radiation. The pellicle is attached to a rectangular metal frame which is in turn connected to a reticle. The anti-static layers are formed by spin coating as described in the first embodiment and are comprised of an ammonium salt as described in the previous embodiment. The preferred thickness of each anti-static layer is about 100 Angstroms and transmission through the pellicle and its two anti-static layers should be greater than 95% of the incident radiation that is selected from wavelengths in the range of 190 to 600 nm. Those skilled in the art will understand that pellicles and ammonium salts can be selected that are highly transparent to wavelengths in the sub-230 nm range such as 193 nm which is commonly used in the industry. This embodiment is an advantage over prior art in that it can protect an attached reticle from voltages that are in the 700V to 2000V range.

While this invention has been particularly shown and described with reference to, the preferred embodiments thereof, it will be understood by those skilled in the art that various changes in form and details may be made without departing from the spirit and scope of the invention.

I claim:

1. A method of protecting a reticle or mask from electrostatic damage comprising the steps of:

(a) providing a reticle or mask that is useful for the patterning of photoresist films which has a patterned opaque coating containing clear regions that are transparent to exposing radiation;

(b) forming an anti-static layer on both faces of a pellicle;

(c) forming an anti-static layer on all surfaces of a metal frame; and (d) attaching one open rectangular side of the frame to one face of the pellicle and attaching the opposite open rectangular side of the frame to the side of the reticle or mask which has a patterned opaque coating, wherein said anti-static layer is a conductive layer capable of dissipating charge build-up.

2. The method of claim 1 wherein the reticle or mask is used for the patterning of microelectronic, MEMS or other devices requiring the formation of small features on a substrate.

3. The method of claim 1 wherein the pellicle is comprised of nitrocellulose.

4. The method of claim 1 wherein the exposing radiation is a wavelength or group of wavelengths selected from the range of about 230 nm to 600 nm.

5. The method of claim 1 wherein the anti-static layer is a quaternary ammonium salt $(R_4N+)X^-$ in which $R_4N+$ has the structure:

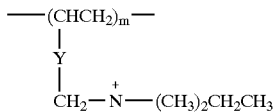

where Y is an alkyl group or preferably $C_6H_4$, m=1 to 10000, and $X^-$ is $Cl^-$.

6. The method of claim 5 wherein the anti-static layer is formed on the pellicle by applying a 0.5% solution of the ammonium salt in water or a suitable alcohol solvent to the center of one face of the pellicle and spin coating and drying, followed by repeating the coating and drying procedure on the opposite face of the pellicle.

7. The method of claim 5 wherein the thickness of each anti-static layer is 500 Angstroms or less and preferably about 100 Angstroms.

8. The method of claim 6 wherein the thickness of the anti-static layers is adjusted to provide a >95% transmission of incident exposing radiation through the pellicle and its two anti-static layers.

9. The method of claim 5 wherein the metal frame is coated with an anti-static layer by spraying or preferably by immersing the frame in a 1.5% solution of the ammonium salt in water or a suitable alcohol solvent for a period of 10 to 60 seconds and then air drying to provide a thickness of 0.1 to 10 microns and preferably about 1.5 microns.

10. The method of claim 1 wherein the metal frame is a good conductor and is preferably aluminum.

11. The method of claim 1 wherein an adhesive, used to attach one open side of the frame to the pellicle and the opposite open side of the frame to the reticle, is selected from a group consisting of conducting and anti-static materials and is preferably an anti-static material such as Fluoroacrylate.

12. The method of claim 1 wherein the exposing radiation is selected from a sub-230 nm wavelength and the pellicle provides a >95% transmission of the exposing radiation.

13. The method of claim 1 wherein the anti-static layer formed on the pellicle is a quaternary ammonium salt $(R_4N+)X^-$ in which $R_4N+$ has the structure:

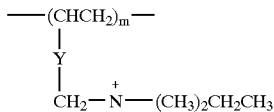

where Y is an alkyl group, m=1 to 10000, and $X^-$ is $Cl^-$.

14. The method of claim 13 wherein the anti-static layer is formed on the pellicle by applying a 0.5% solution of the ammonium salt in water or a suitable alcohol solvent to the center of one face of the pellicle and spin coating and drying, followed by repeating the coating and drying procedure on the opposite face of the pellicle.

15. The method of claim 14 wherein the thickness of each anti-static layer is less than 500 Angstroms and preferably adjusted to provide a >95% transmission of incident exposing radiation through the pellicle and its two anti-static layers.

16. The method of claim 1 wherein the anti-static layer formed on the frame is a quaternary ammonium salt $(R_4N+)X^-$ in which $(R_4N+)$ preferably has the structure:

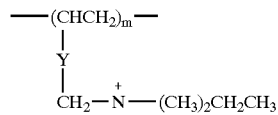

where Y is an alkyl group, m=1 to 10000, and $X^-$ is $Cl^-$.

17. The method of claim 16 wherein the metal frame is preferably aluminum and the thickness of the anti-static layer on the frame is preferably about 1.5 microns.

18. The method of claim 1 wherein the frame is detached from the reticle and pellicle to allow cleaning or repair of the reticle or to replace a damaged pellicle with a new pellicle having anti-static layers, said frame is then reattached to the reticle and to the new pellicle having anti-static layers on both faces.

19. A method of protecting a reticle or mask from electrostatic damage comprising the steps of:

(a) providing a reticle or mask that is useful for the patterning of photoresist films which has a patterned opaque coating containing clear regions that are transparent to exposing radiation;

(b) forming an anti-static layer on both faces of a pellicle;

(c) attaching said pellicle to one open rectangular side of a rectangular metal frame; and (d) attaching the opposite open rectangular side of said frame to the side of said reticle or mask which has a patterned opaque coating, wherein said anti-static layer is a conductive layer capable of dissipating charge build-up.

20. The method of claim 19 wherein the anti-static layer is a quaternary ammonium salt $(R_4N+)X^-$ in which $R_4N+$ has the structure:

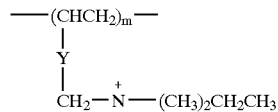

where Y is an alkyl group or preferably $C_6H_4$, m=1 to 10000, and $X^-$ is $Cl^-$.

21. The method of claim 19 wherein the thickness of each anti-static layer on the pellicle is preferably less than 500 Angstroms and provides a >95% transmission of incident exposing radiation through the pellicle and two anti-static layers.

22. An article that is useful for protecting a reticle or mask from electrostatic damage while it is attached to the side of said reticle or mask which contains a patterned opaque film with clear openings that are transparent to exposing radiation, said article comprising:

(a) a pellicle that is highly transparent to the exposing radiation used with said reticle or mask to pattern device substrates, said pellicle having a layer of anti-static material on both faces; and (b) a metal frame which has an anti-static layer on all surfaces and is attached on one open rectangular side to one face of said pellicle with an adhesive, said metal frame having a second open rectangular side opposite to the first said rectangular side that is available to attach to said reticle or mask, wherein said anti-static layer is a conductive layer capable of dissipating charge build-up.

23. The article of claim 22 wherein the anti-static material is a quaternary ammonium salt $(R_4N+)X^-$ in which $R_4N+$ has the structure:

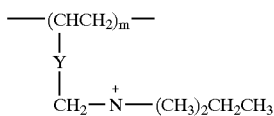

where Y is an alkyl group or $C_6H_4$. m=1 to 10000, and $X^-$ is $Cl^-$.

24. The article of claim 23 wherein the anti-static layer is formed on the pellicle by applying a 0.5% solution of the ammonium salt in water or a suitable alcohol solvent to the center of one face of the pellicle and spin coating and drying, followed by repeating the coating and drying procedure on the opposite face of the pellicle.

25. The article of claim 23 wherein the anti-static layers are formed on the pellicle by spraying, dipping, or other means of applying thin uniform coatings that provide >95% transmission of exposing radiation through the anti-static layers and pellicle.

26. The article of claim 24 wherein the thickness of each anti-static layer is less than 500 Angstroms and is preferably about 100 Angstroms.

27. The article of claim 22 wherein said exposing radiation is selected from one or more wavelengths in the range of about 230 nm to 600 nm.

28. The article of claim 22 wherein the pellicle is attached to the frame with an adhesive selected from a group comprised of conducting or anti-static materials and is preferably Fluoro-acrylate, an anti-static material.

29. The article of claim 22 wherein the anti-static layer formed on the frame is a quaternary ammonium salt $(R_4N+)X$ in which salt $(R_4N+)$ preferably has the structure:

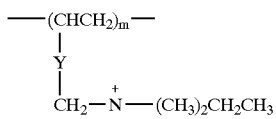

where Y is an alkyl group or $C_6H_4$, m=1 to 10000, and X is $Cl^-$.

30. The article of claim 22 wherein the metal frame is preferably aluminum and the thickness of the anti-static layer on the frame is preferably about 1.5 microns.

* * * * *